United States Patent
Lhee et al.

(10) Patent No.: US 8,599,113 B2
(45) Date of Patent: Dec. 3, 2013

(54) ORGANIC LIGHT EMITTING DISPLAY DEVICE AND METHOD OF MANUFACTURING THE SAME

(75) Inventors: Zail Lhee, Yongin (KR); Sang-Mok Hong, Yongin (KR)

(73) Assignee: Samsung Display Co., Ltd. (KR)

( * ) Notice: Subject to any disclaimer, the term of this patent is extended or adjusted under 35 U.S.C. 154(b) by 424 days.

(21) Appl. No.: 12/553,894

(22) Filed: Sep. 3, 2009

(65) Prior Publication Data

US 2010/0117936 A1    May 13, 2010

(30) Foreign Application Priority Data

Nov. 10, 2008    (KR) .................. 10-2008-0110924

(51) Int. Cl.
  *G09G 3/32*    (2006.01)
(52) U.S. Cl.
  USPC ............................................................ 345/76
(58) Field of Classification Search
  None
  See application file for complete search history.

(56) References Cited

U.S. PATENT DOCUMENTS

| | | | |
|---|---|---|---|
| 6,146,715 A | 11/2000 | Kim et al. | |
| 6,204,610 B1* | 3/2001 | Komiya | 345/76 |
| 2002/0145381 A1 | 10/2002 | Humbs | |
| 2003/0006699 A1 | 1/2003 | Ogino et al. | |
| 2005/0001546 A1 | 1/2005 | Yamaguchi | |
| 2005/0012094 A1 | 1/2005 | Park | |
| 2005/0035708 A1 | 2/2005 | Yamazaki et al. | |
| 2005/0142975 A1 | 6/2005 | Lee et al. | |
| 2005/0151462 A1 | 7/2005 | Miyagawa | |
| 2006/0024855 A1 | 2/2006 | Sano | |
| 2006/0170339 A1 | 8/2006 | Kanno et al. | |
| 2006/0246620 A1 | 11/2006 | Nagayama et al. | |
| 2007/0063636 A1 | 3/2007 | Guenther et al. | |
| 2008/0204377 A1* | 8/2008 | Kajiyama et al. | 345/76 |
| 2008/0224607 A1 | 9/2008 | Matsuo et al. | |

FOREIGN PATENT DOCUMENTS

| | | |
|---|---|---|
| CN | 1905204 | 1/2007 |
| JP | 08-222371 | 8/1996 |
| JP | 2001109399 | 4/2001 |
| JP | 2001-189192 | 7/2001 |
| JP | 2001-244073 | 9/2001 |
| JP | 2002246185 | 8/2002 |
| JP | 2002-324672 | 11/2002 |
| JP | 2004-205690 | 7/2004 |
| JP | 2005518080 | 6/2005 |
| JP | 2005-203351 | 7/2005 |
| JP | 2005-317382 | 11/2005 |

(Continued)

OTHER PUBLICATIONS

Office Action dated Sep. 20, 2011, received in Japanese Patent Application No. 2009-033187, claiming priority to Korean priority application 10-2008-0110924.
Office Action dated Apr. 29, 2010 in KR priority application No. 10-2008-0110924.

(Continued)

*Primary Examiner* — Joseph Haley
(74) *Attorney, Agent, or Firm* — Knobbe Martens Olson & Bear LLP

(57) ABSTRACT

An organic light emitting display device and a method of manufacturing the same are disclosed. The organic light emitting display device includes a substrate on which first, second and third pixel units are arranged in row and column directions. To simplify manufacturing and reduce defects, the first, second and third pixel units are arranged so that each column of the display is formed of only one of the first, second, and third pixel units.

4 Claims, 5 Drawing Sheets

(56) References Cited

FOREIGN PATENT DOCUMENTS

| | | |
|---|---|---|
| JP | 2007503686 | 2/2007 |
| JP | 2007234232 | 9/2007 |
| JP | 2007-311238 | 11/2007 |
| JP | 2008041747 | 2/2008 |
| JP | 2008-251270 | 10/2008 |
| KR | 10-2000-0073038 | 12/2000 |
| KR | 10-2006-0055941 | 5/2006 |
| KR | 10-2006-0058458 | 5/2006 |
| KR | 10-2007-0112447 A | 11/2007 |
| TW | I232700 | 1/2005 |
| TW | I286385 | 9/2007 |

OTHER PUBLICATIONS

Oct. 28, 2010 Office Action in priority Korean Patent Application No. 10-2008-0110924.
Office Action dated Jan. 17, 2012 in corresponding Japanese Patent Application No. 2009-033187.
Chinese Office Action in the corresponding Chinese Patent Application No. 200910212119.4 dated Jun. 16, 2011.
Office Action dated May 15, 2012 in corresponding Japanese Patent Application No. 2009-033187.
Office Action dated May 22, 2013 in corresponding Taiwanese Patent Application No. 098134085.
EPO Communication dated Mar. 27, 2013 in corresponding European Patent Application No. 09175501.7.

* cited by examiner

ORGANIC LIGHT EMITTING DISPLAY DEVICE AND METHOD OF MANUFACTURING THE SAME

CROSS-REFERENCE TO RELATED APPLICATIONS

This application claims priority to and the benefit of Korean Patent Application No. 10-2008-0110924, filed on Nov. 10, 2008, in the Korean Intellectual Property Office, the entire content of which is incorporated herein by reference.

BACKGROUND

1. Field

The field relates to an organic light emitting display device and a method of manufacturing the same, and more particularly, to an organic light emitting display device and a method of manufacturing the same in which an organic light emitting layer can be easily formed and manufacturing defects can be minimized.

2. Description of the Related Technology

An organic light emitting display device is a next-generation display device having self-luminescent characteristics. The organic light emitting display device has superior characteristics when compared to a liquid crystal display device (LCD) in view of viewing angle, contrast, response speed and power consumption.

An organic light emitting diode of a pixel of an organic light emitting display device includes an anode electrode, a cathode electrode and an organic light emitting layer. The organic light emitting diode emits light as the result of the recombination in the organic light emitting layer of holes and electrons injected through the anode and cathode electrodes respectively.

Generally, an organic light emitting layer of an organic light emitting device is formed by a vacuum deposition method using a shadow mask. A shadow mask has been disclosed in Korean Patent Publication No. 10-2004-0042179 (May 20, 2004). For selective deposition of an organic material, dot- or substantially rectangular-shaped openings are formed in the shadow mask.

However, in the conventional method using a shadow mask, when the shadow mask is thin, it is difficult to deposit the organic material into a precise pattern (shape) due to bending of the shadow mask. When the shadow mask is thick, the organic material may not be deposited at certain portions because of an evaporation angle of the organic material. In a full-color display device, mask alignment and deposition processes are performed several times so as to form respective red, green and blue light emitting layers. For this reason, the manufacturing process is complicated, and defects caused by contamination are produced.

SUMMARY OF CERTAIN INVENTIVE ASPECTS

One aspect is an organic light emitting display device, including a substrate including a plurality of areas arranged in row and column directions, where each column of areas is designated for one of first, second and third pixel units, an insulating layer formed in the areas, a plurality of first electrodes formed on the insulating layer, where each electrode is formed in one of the areas, a first light emitting layer formed on the first electrodes in the column of the first pixel units, a second light emitting layer formed on the first electrodes in the column of the second pixel units, a third light emitting layer formed on the first electrodes in the column of the third pixel units, and a second electrode formed on the first, second, and third light emitting layers.

Another aspect is an organic light emitting display device, including a substrate including a plurality of areas arranged in row and column directions, where each column of areas is designated for one of first, second and third pixel units, a plurality of first electrodes formed on the areas where each electrode is formed in one of the areas, a pixel defining layer formed on the substrate, where the pixel defining layer is patterned to expose the first electrodes, a first light emitting layer formed on the first electrodes in the column of the first pixel units, a second light emitting layer formed on the first electrodes in the column of the second pixel units, a third light emitting layer formed on the first electrodes in the column of the third pixel units, and a second electrode formed on the first, second, and third light emitting layers.

Another aspect is a method of manufacturing an organic light emitting display device, including providing a substrate including a plurality of areas arranged in row and column directions, where each column of areas is designated for one of first, second and third pixel units, forming an insulating layer in the areas, forming a plurality of first electrodes on the insulating layer, where each electrode is formed in one of the areas, forming a first light emitting layer on the substrate, removing at least a portion of the first light emitting layer in areas other than in the column of first pixel units, forming a second light emitting layer on the substrate, removing at least a portion of the second light emitting layer formed in areas other than in the column of the second pixel units, forming a third light emitting layer on the substrate, removing at least a portion of the third light emitting layer formed in areas other than in the column of the second pixel units, and forming a second electrode on the first, second and third light emitting layers.

Another aspect is a method of manufacturing an organic light emitting display device, including providing a substrate including a plurality of areas arranged in row and column directions, where each column of areas is designated for one of first, second and third pixel units, forming a plurality of first electrodes on the areas where each electrode is formed in one of the areas, forming a pixel defining layer on the substrate, patterning the pixel defining layer to expose the first electrodes, forming a first light emitting layer on the substrate, removing at least a portion of the first light emitting layer in areas other than in the column of first pixel units, forming a second light emitting layer on the substrate, removing at least a portion of the second light emitting layer in areas other than in the column of second pixel units, forming a third light emitting layer on the substrate, removing at least a portion of the third light emitting layer in areas other than in the column of third pixel units, and forming a second electrode on the first, second and third light emitting layers.

BRIEF DESCRIPTION OF THE DRAWINGS

The accompanying drawings, together with the specification, illustrate exemplary embodiments.

DETAILED DESCRIPTION OF CERTAIN INVENTIVE ASPECTS

Figure 1A:
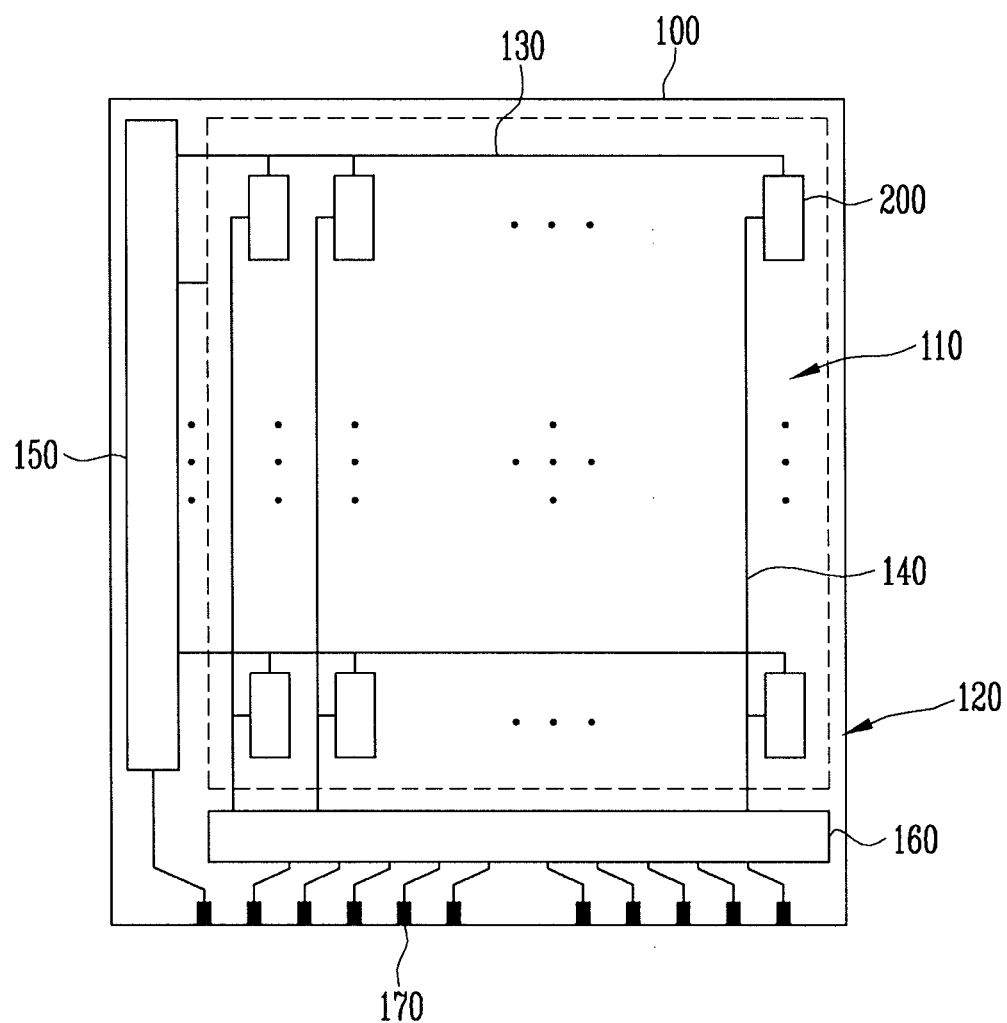
FIGS. 1A and 1B are a schematic plan view and a cross-sectional view of an organic light emitting display device according to an embodiment.

Certain embodiments provide an organic light emitting display device and a method of manufacturing the same in which an organic light emitting layer can be easily formed.

Certain embodiments also provide an organic light emitting display device and a method of manufacturing the same in which a defect rate can be minimized.

According to one aspect, an organic light emitting display device is disclosed. The device includes a substrate on which first, second and third pixel units are arranged in row and column directions; an insulating layer formed on the substrate having the first, second and third pixel units; first electrodes formed on the insulating layer having the first, second and third pixel units; a first light emitting layer formed on the first electrodes in the column of the first pixel units and the insulating layer; a second light emitting layer formed on the first electrodes in the column of the second pixel units and the insulating layer; a third light emitting layer formed on the first electrodes in the column of the third pixel units and the insulating layer; and a second electrode formed on the substrate having the first, second and third light emitting layers.

According to another aspect, an organic light emitting display device is disclosed. The device includes a substrate on which first, second and third pixel units are arranged in row and column directions; first electrodes formed on the substrate having the first, second and third pixel units; a pixel defining layer formed on the substrate having the first electrodes, the pixel defining layer being patterned to expose the first electrodes; a first light emitting layer formed on the first electrodes in the column of the first pixel units and the pixel defining layer; a second light emitting layer formed on the first electrodes in the column of the second pixel units and the pixel defining layer; a third light emitting layer formed on the first electrodes in the column of the third pixel units and the pixel defining layer; and a second electrode formed on the substrate having the first, second and third light emitting layers.

According to still another aspect, a method of manufacturing an organic light emitting display device is disclosed. The method includes providing a substrate on which first, second and third pixel units are arranged in row and column directions; forming an insulating layer on the substrate having the first, second and third pixel units; forming first electrodes on the insulating layer having the first, second and third pixel units; forming a first light emitting layer on an entire surface of the substrate and then removing the first light emitting layer formed on the first electrodes in the columns of the second and third pixel units and the insulating layer; forming a second light emitting layer on the entire surface of the substrate and then removing the second light emitting layer formed on the first light emitting layer in the column of the first pixel units, the first electrodes in the column of the third pixel units and the insulating layer; forming a third light emitting layer on the entire surface of the substrate and then removing the third light emitting layer formed on the first light emitting layer in the column of the first pixel units and the second light emitting layer in the column of the second pixel units; and forming a second electrode on the substrate having the first, second and third light emitting layers.

According to still another aspect, a method of manufacturing an organic light emitting display device is disclosed. The method includes providing a substrate on which first, second and third pixel units are arranged in row and column directions; forming first electrodes on the substrate having the first, second and third pixel units; forming a pixel defining layer on the substrate having the first electrodes and then exposing the first electrodes; forming a first light emitting layer on an entire surface of the substrate and then removing the first light emitting layer formed on the first electrodes in the columns of the second and third pixel units and the pixel defining layer; forming a second light emitting layer on the entire surface of the substrate and then removing the second light emitting layer formed on the first light emitting layer on in column of the first pixel units, the first electrodes in the column of the third pixel units and the pixel defining layer; forming a third light emitting layer on the entire surface of the substrate and then removing the third light emitting layer formed on the first light emitting layer in the column of the first pixel units and the second light emitting layer in the column of the second pixel units; and forming a second electrode on the substrate having the first, second and third light emitting layers.

According to certain embodiments, organic light emitting layers are formed in a substantially rectangular shape in the columns of respective pixel units by patterning red, green and blue light emitting layer using a laser. A mask having openings is used to expose the entire pixel region, so that the mask can be easily manufactured. Since the red, green and blue light emitting layers are all formed using a mask, manufacturing cost can be saved. Further, the red, green and blue light emitting layers are selectively removed using a laser, so that the organic light emitting layers can be formed in a precise pattern (shape), and a defect ratio due to contamination can be prevented.

Only certain exemplary embodiments are shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, the element can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Hereinafter, like reference numerals generally refer to like elements.

Figure 1B:
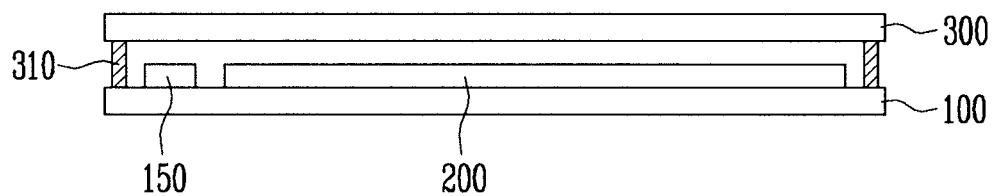

FIGS. 1A and 1B are a schematic plan view and a cross-sectional view of an organic light emitting display device according to an embodiment.

Referring to FIG. 1A, a substrate 100 has a pixel region 110 and a non-pixel region 120. In this embodiment, the non-pixel region 120 is a region surrounding the pixel region 110 or the region excluding the pixel region 110 on the substrate 100.

A plurality of pixel units 200 including light emitting devices connected in a matrix form between scan and data lines 130 and 140 are arranged in a pixel region 110 on the substrate 100. The plurality of pixel units 200 are arranged in column and row directions and include red, green and blue pixel units. For example, red, green and blue pixels may be sequentially and repeatedly arranged in a row direction, and red, green or blue pixels may be consecutively arranged.

In the non-pixel region 120 on the substrate 100 scan and data lines 130 and 140 respectively are disposed in the pixel region 110. Power supply lines (not shown) supply power for operating the light emitting devices and scan and data driving units 150 and 160 process signals provided from the outside of the organic light emitting display device through pads 170. The scan and data driving units 150 and 160 include driving circuits that convert signals provided from the outside of the organic light emitting display device through the pads 170 into scan and data signals, thereby selectively driving the respective pixels.

Referring to FIG. 1b, a sealing substrate 300 sealing the pixel region 110 is disposed above the substrate 100 having the plurality of pixel units 200. The sealing substrate 300 and the substrate 100 are joined together by a sealing member 310.

Figure 2:
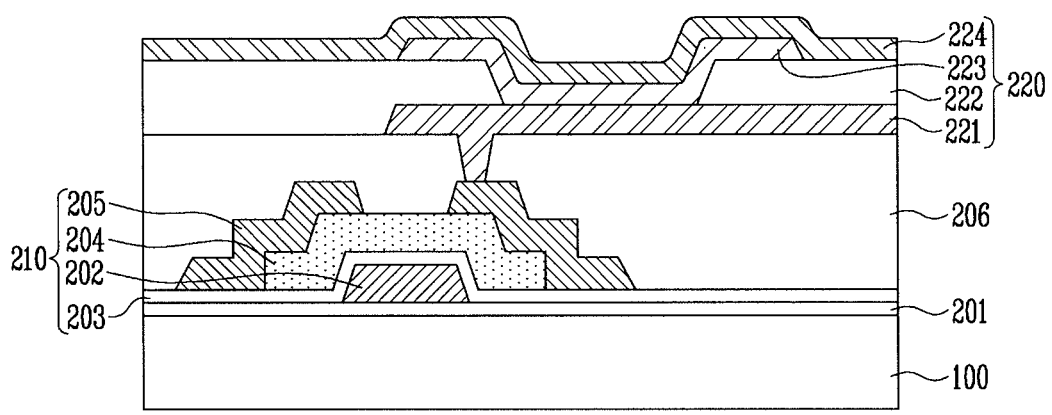
FIG. 2 is a cross-sectional view of a pixel unit shown in FIG. 1A.

FIG. 2 is a cross-sectional view of an embodiment of a pixel unit 200 shown in FIG. 1A. The pixel unit of FIG. 2 includes a light emitting device, a thin film transistor (TFT) to control the operation of the light emitting device, and a capacitor to maintain a signal. However, only the TFT and the light emitting device are shown herein for convenience of illustration.

Referring to FIG. 2, the light emitting device 220 includes an anode electrode 221, a cathode electrode 224, and an organic light emitting layer 223 interposed between the anode and cathode electrodes 221 and 224.

Anode electrodes 221 are formed in the plurality of pixel units 200 on the substrate 100. The organic light emitting layer 223 is formed in a light emitting region (a region to which the anode electrode 221 is exposed), defined by a pixel defining layer 222. The organic light emitting layer 223 may include a hole injection layer, a hole transfer layer, an electron transfer layer and an electron injection layer. The cathode layer 224 is formed on the organic light emitting layer 223 in the pixel unit 200.

The TFT 210 includes a semiconductor layer 204 providing source and drain regions and a channel region, a gate electrode 202 isolated from the semiconductor layer 204 by a gate insulating layer 203, and source and drain electrodes 205 connected to the semiconductor layer 204 in the source and drain regions. Layers 201 and 206 are a buffer layer and a planarized insulating layer, respectively.

Figure 3:
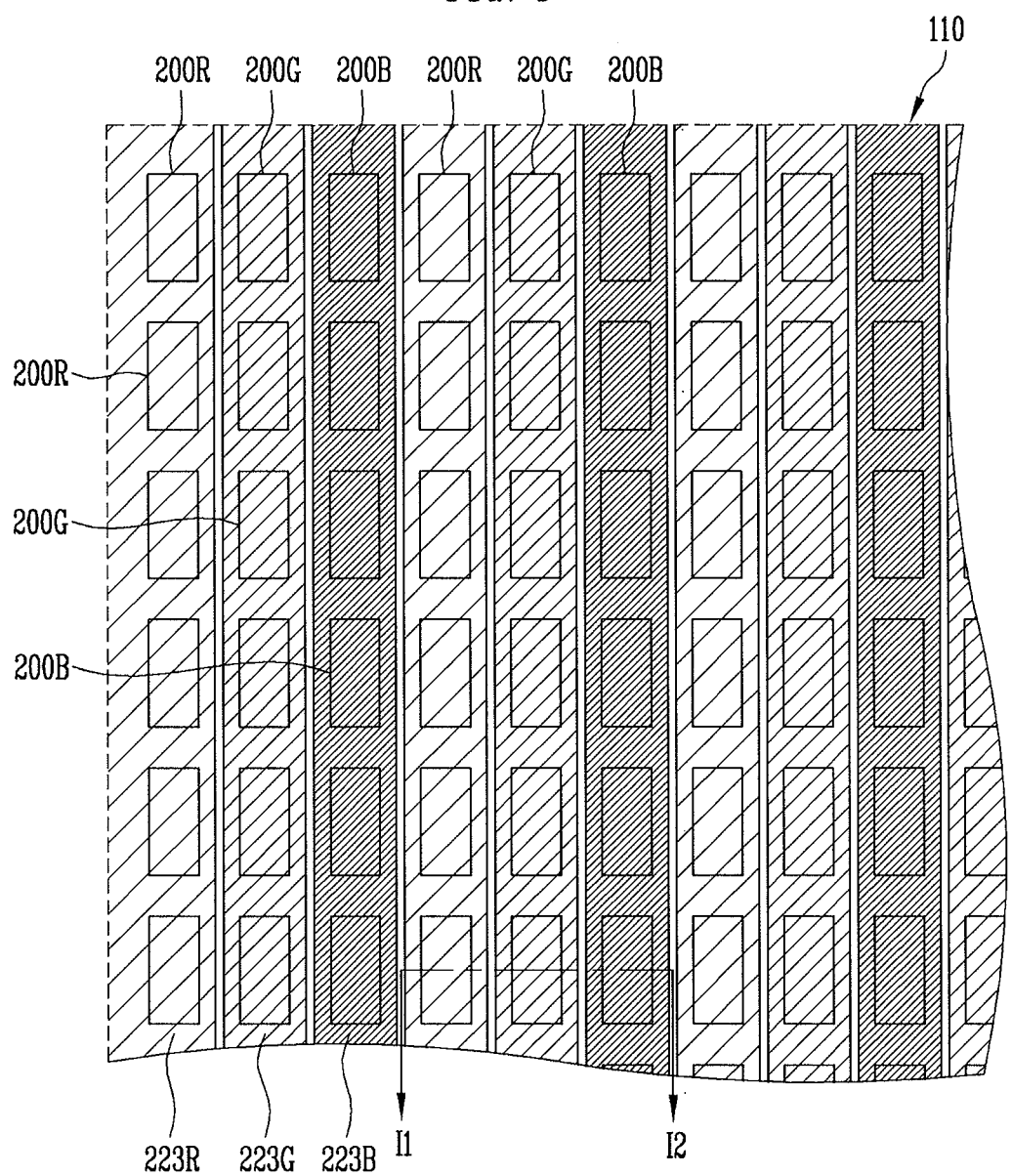
FIG. 3 is a schematic plan view of a pixel region illustrating an organic light emitting layer of the pixel unit of FIG. 2.

FIG. 3 is a schematic plan view of the pixel region 110 illustrating the organic light emitting layer 223 of FIG. 2. A plurality of pixel units 200 are arranged in row and column directions.

The plurality of pixel units 200 include red, green and blue pixel units 200R, 200G and 200B. An organic light emitting layer 223R of light emitting devices 220 of red pixel units 200R is formed in a substantially rectangular shape on the pixel defining layer 222. Anode electrodes 221 are arranged in a column of red pixel units 200R. An organic light emitting layer 223G of light emitting devices 220 of green pixel units 200G is formed in a substantially rectangular shape on the pixel defining layer 222. Anode electrodes 221 are arranged in a column of green pixel units 200G. An organic light emitting layer 223B of light emitting devices 220 of blue pixel units 200B is formed in a substantially rectangular shape on the pixel defining layer 222. Anode electrodes 221 are arranged in a column of blue pixel units 200B.

In some embodiments, the pixel defining layer 222 may not be provided. In this case, the organic light emitting layer 223R of light emitting devices 220 of red pixel units 200R is formed in a substantially rectangular shape on the insulating layer 206 and anode electrodes 221 arranged in a column of red pixel units 200R. In addition, the organic light emitting layer 223G of light emitting devices 220 of green pixel units 200G is formed in a substantially rectangular shape on the insulating layer 206 and anode electrodes 221 arranged in a column of green pixel units 200G. Furthermore, an organic light emitting layer 223B of light emitting devices 220 of blue pixel units 200B is formed in a substantially rectangular shape on the insulating layer 206 and anode electrodes 221 arranged in a column of blue pixel units 200B.

FIGS. 4A to 4F are cross-sectional views illustrating a method of manufacturing an organic light emitting display device according to an embodiment. FIGS. 4A to 4F show cross-sections taken along line 11-12 of FIG. 3 at various stages in the method.

Figure 4A:
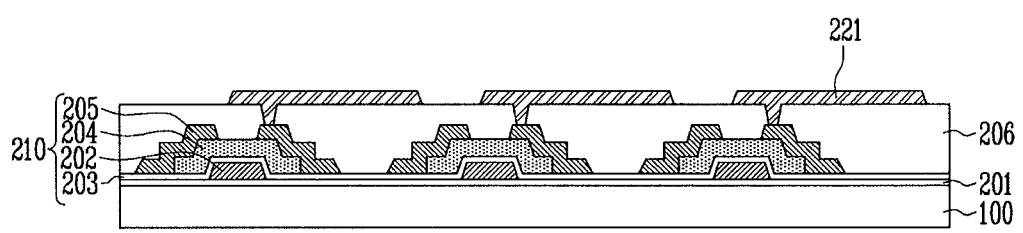
FIGS. 4A to 4F are cross-sectional views illustrating a method of manufacturing an organic light emitting display device according to an embodiment.

Referring to FIG. 4A, a planarizing insulating layer 206 is formed on a substrate 100 where TFTs 210 are formed in respective red, green and blue pixel units 200R, 200G and 200B as shown in FIG. 2. A via hole is formed so that a source or drain electrode 205 is exposed therethrough. An anode electrode 221 is formed to connect to the source or drain electrode 205 through the via hole.

Figure 4B:
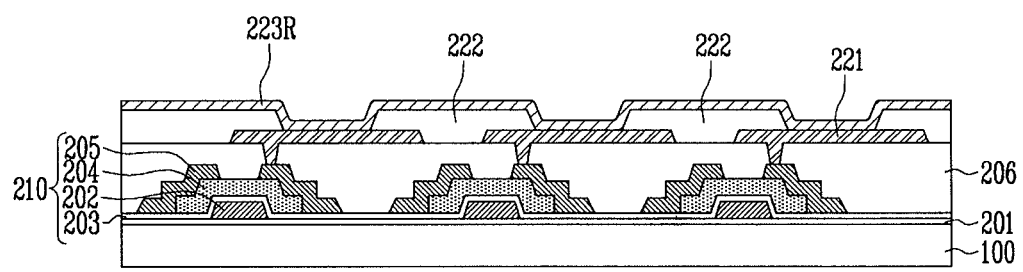

Referring to FIG. 4B, a pixel defining layer 222 is formed on the substrate 100 having the anode electrodes 221 and is patterned so that the anode electrodes 221 in light emitting regions are exposed. Subsequently, a red light emitting layer 223R is formed on the pixel defining layer 222 having the anode electrodes 221.

Figure 4C:
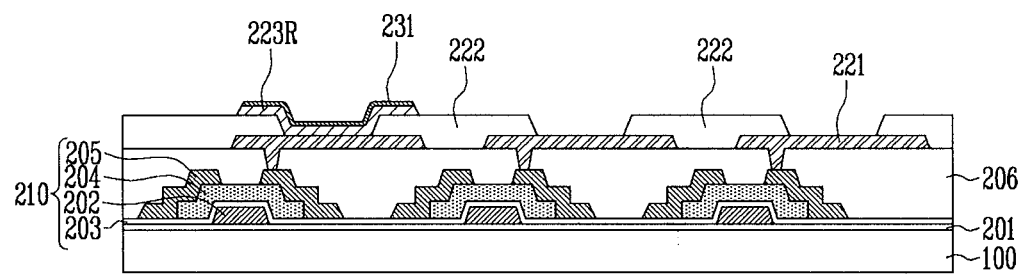

Referring to FIG. 4C, the red light emitting layer 223R remains in a substantially rectangular shape in only the column of the red pixel units 200R because the red light emitting layer 223R has been removed elsewhere.

Figure 4D:
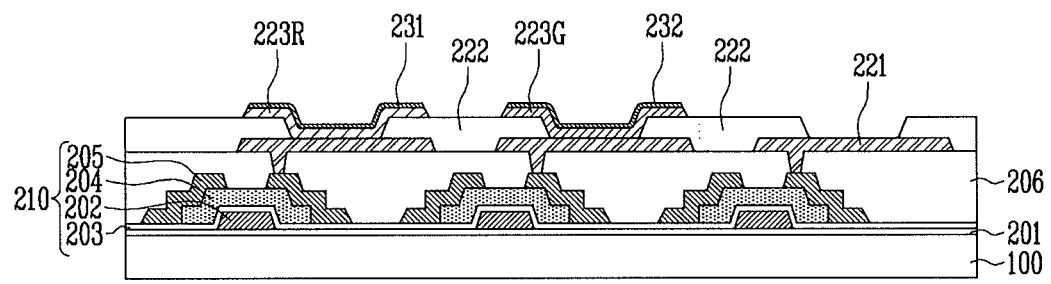

Referring to FIG. 4D, after a green light emitting layer 223G is formed on the entire surface of the substrate 100 having the red light emitting layer 223R, the green light emitting layer 223G remains in a substantially rectangular shape in only the column of the green pixel units 200G because the green light emitting layer 223G has been removed elsewhere.

Figure 4E:
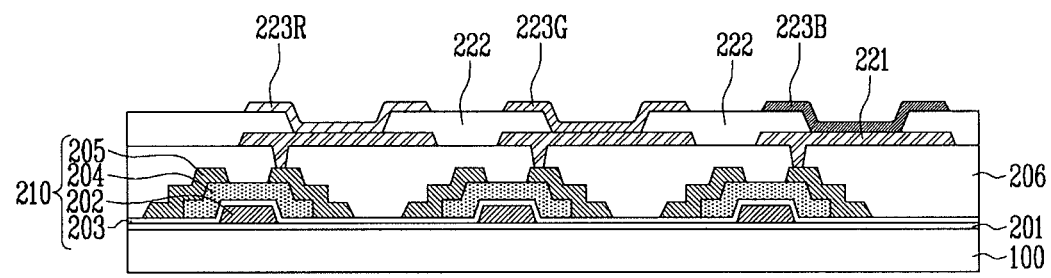

Referring to FIG. 4E, after a blue light emitting layer 223B is formed on the entire surface of the substrate 100 having the red and green light emitting layers 223R and 223G, the blue light emitting layer 223B remains in a substantially rectangular shape in only the column of the blue pixel units 200B because the blue light emitting layer 223B has been removed elsewhere.

Figure 4F:
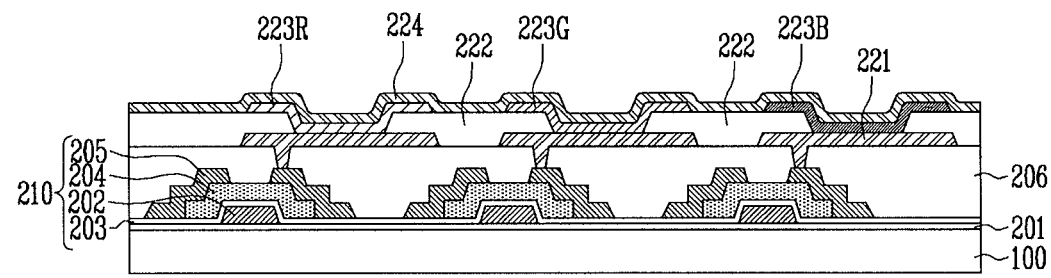

Referring to FIG. 4F, a cathode electrode 224 is formed on the entire surface of the substrate 100 having the red, green and blue light emitting layers 223R, 223G and 223B.

In this embodiment, a mask having openings may be used so that the pixel region 110 is exposed when the red, green and blue light emitting layers 223R, 223G and 223B are formed. In this case, since the mask has the openings with a simple shape, the mask can be easily manufactured. Since the red, green and blue light emitting layers 223R, 223G and 223B are all formed using the same mask, manufacturing cost can be saved.

A laser may be used for selectively removing the temporary portions of the red, green and blue light emitting layers 223R, 223G and 223B. The power, wavelength and/or irradiation time of the laser is controlled, so that only desired light emitting layers 223R, 223G and 223B are selectively removed without damaging layers near the light emitting layers 223R, 223G and 223B. Alternatively, a passivation layer 231 made of a material having a slow etching speed with respect to the other layers may be formed on the red light emitting layer 223R in the process of FIG. 4C. A passivation layer 232 made of a material having a slow etching speed with respect to the other layers may be formed on the green light emitting layer 223G in the process of FIG. 4D. As a result, damage of the red and green light emitting layers 223R and 223G can be minimized in the process of selectively removing the green and blue light emitting layers 223G and 223B.

If the passivation layers 231 and 232 are formed of a conductive material, the operations of the light emitting devices 220 are not influenced even if the passivation layers 231 and 232 are not removed in the process of removing the undesired portions of the green and blue light emitting layers 223G and 223B.

While the present invention has been described in connection with certain exemplary embodiments, it is to be understood that the invention is not limited to the disclosed embodiments, but, on the contrary, is intended to cover various modifications and equivalent arrangements.

What is claimed is:

1. An organic light emitting display device, comprising:
   a substrate comprising a plurality of areas arranged in rows and columns, wherein each column comprises a plurality of first pixel units, a plurality of second pixel units or a plurality of third pixel units;
   a plurality of first electrodes formed on the areas wherein each electrode is formed in one of the plurality of first pixel units, in one of the plurality of second pixel units, or in one of the plurality of third pixel units;
   a pixel defining layer formed on the substrate, wherein the pixel defining layer is patterned to have openings exposing the first electrodes;
   a first continuous light emitting layer formed on and across more than one of the first electrodes and the pixel defining layer in the column of the plurality of first pixel units;
   a second continuous light emitting layer formed on and across more than one of the first electrodes and the pixel defining layer in the column of the plurality of second pixel units;
   a third continuous light emitting layer formed on and across more than one of the first electrodes and the pixel defining layer in the column of the plurality of third pixel units; and
   a second electrode formed on the first, second, and third continuous light emitting layers.

2. The organic light emitting display device of claim 1, wherein the first, second and third continuous light emitting layers are each patterned in a substantially rectangular shape.

3. The organic light emitting display device of claim 1, wherein the first, second and third continuous light emitting layers are red, green and blue light emitting layers, respectively.

4. The organic light emitting display device of claim 1, further comprising a thin film transistor connected to each of the first electrodes.

* * * * *